United States Patent [19]
Shurtliff

[11] Patent Number: 5,870,792
[45] Date of Patent: Feb. 16, 1999

[54] APPARATUS FOR CLEANING WAFERS AND DISCS

[75] Inventor: Eric C. Shurtliff, Phoenix, Ariz.

[73] Assignee: SpeedFam Corporation, Chandler, Ariz.

[21] Appl. No.: 829,056

[22] Filed: Mar. 31, 1997

[51] Int. Cl.⁶ .................. B08B 1/04; B08B 11/00
[52] U.S. Cl. .................. 15/102; 15/97.1; 15/230.16; 15/244.1
[58] Field of Search .................. 15/97.1, 102, 180, 15/187, 188, 230, 230.12, 230.14, 230.16, 230.19, 244.1, 244.4

[56] References Cited

U.S. PATENT DOCUMENTS

| | | | |
|---|---|---|---|
| 1,809,907 | 6/1931 | Newcomb | 15/230 |
| 1,861,347 | 5/1932 | Johnson | 15/188 |
| 2,186,050 | 1/1940 | Vaughn | 15/244.1 |
| 3,128,487 | 4/1964 | Vallis | 15/187 X |
| 3,368,230 | 2/1968 | Kramer | 15/245 X |
| 4,403,367 | 9/1983 | Brown et al. | 15/230.12 |
| 4,998,314 | 3/1991 | Borofsky | 15/230.16 X |
| 5,144,711 | 9/1992 | Gill, Jr. | 15/97.1 |
| 5,311,634 | 5/1994 | Andros | 15/97.1 |

*Primary Examiner*—Mark Spisich
*Attorney, Agent, or Firm*—Snell & Wilmer, L.L.P.

[57] ABSTRACT

An apparatus for cleaning workpieces such as magnetic recording discs, optical discs, and semiconductor wafers includes a sponge-like material surrounded on two sides by substantially rigid plates that serve as an exoskeleton support for the sponge-like material. The plates include a number of apertures formed therein. The sponge-like material protrudes through the apertures of the plates, allowing the sponge-like material to contract a surface of the workpiece during the cleaning process.

12 Claims, 3 Drawing Sheets

APPARATUS FOR CLEANING WAFERS AND DISCS

TECHNICAL FIELD

The present invention relates, generally, to an apparatus for cleaning workpieces, and, more particularly, to an apparatus for cleaning workpieces such as magnetic recording discs, optical recording discs, and semiconductor wafers.

BACKGROUND ART AND TECHNICAL PROBLEMS

The production of discs used in the magnetic disc drive industry begins with the creation of a substrate with a hard smooth surface that magnetic material can be deposited onto. A hard smooth surface may be formed by coating a relatively soft material such as an aluminum disc with a hard material such as nickel. The hard material is polished to a smooth finish, and magnetic material is then deposited onto the hard material surface of the disc. Several methods for depositing magnetic material onto the disc surface can be used; for example, electrodeposition and sputtering are two well known methods.

After polishing, the workpieces are then typically cleaned prior to the surface deposition of magnetic material. If the surface of the workpiece is contaminated with debris from the polishing process or elsewhere, the adherence of the magnetic material to the surface of the workpiece will be imperfect, and "blisters" of missing magnetic material will form on the surface of the workpiece. These "blisters" create areas on the workpiece that are incapable of storing information. Similarly, in optical disc manufacturing, debris on the surface of the workpiece may cause voids in information storage. In semiconductor wafer manufacturing, debris may attach to the surface of the workpiece, causing defects on the surface of the workpiece. These defects can cause electrical shorts or other problems within the microelectronic structures on the workpiece. Accordingly, it is often important to clean the workpieces to remove debris from the corresponding surfaces.

Contact scrubbing with sponge-like material is one method used to remove debris from the surface of the workpiece. A typical prior art cleaning device used for contact scrubbing of workpieces is described in U.S. Pat. No. 5,311,634, issued May 17, 1994 to Andros, the entire content of which is hereby incorporated by reference. A typical prior art cleaning device is also schematically shown in FIG. 1. Referring to FIG. 1, cleaning device 10 includes sponge-like material 12 and a core 14. Cleaning device 10 has two substantially coplanar surfaces 16 and 18. Sponge-like material 12 is "grown" over core 14 and seals with itself at an outer edge 20 of core 14. Sponge-like material 12 may be made of a variety of resilient materials, including poly vinyl alcohol and urethanes. Core 14 has an aperture 22 at its center to allow a rotatable shaft 24 to be inserted therein. Core 14 may also have two keyways 26(a) and 26(b) formed within aperture 22 and configured to receive a key 30 on rotatable shaft 24. Key 30 and keyways 26(a) and 26(b) enable rotatable shaft 24 and cleaning devices 10 to rotate as a single unit.

Core 14 is often made of a substantially rigid material. Thus, as a force is applied by key 30 to keyway 26(a) or 26(b), core 14 may become deformed, allowing cleaning device 10 to slip on rotatable shaft 24. In addition, because core 14 is somewhat flexible, as more cleaning devices 10 are attached to rotatable shaft 24, the pressure exerted on the workpiece from surfaces 16 and 18 changes from the center to the edge of rotatable shaft 24. For example, for a rotatable shaft 24 containing fifty-two cleaning devices 10, the cumulative displacement of cleaning devices 10 in the direction substantially parallel to the axis of rotatable shaft 24 may be 0.5". The changing pressure exerted by cleaning device 10 on the workpieces may yield unpredictable cleaning of the workpieces.

When multiple cleaning devices 10 are placed on rotatable shaft 24, a number of spacers 32 are often interposed between adjacent cleaning devices 10 to ensure substantially identical spacing between all cleaning devices 10. Unfortunately, attaching spacers 32 to rotatable shaft 24 is time consuming and labor intensive. Spacers 32 also tend to wear and become contaminated, causing nonuniform spacing between cleaning devices 10. Such nonuniform spacing between cleaning elements 10 may cause unpredictable workpiece cleaning.

In addition to the above shortcomings of the prior art, cleaning devices 10 are difficult to correctly align on rotatable shaft 24. As shown in FIG. 1, keyways 26(a) and 26(b) enable cleaning device 10 to be mounted onto rotatable shaft 24 in four different ways. In particular, cleaning device 10 could be mounted with its front surface 16 forward with keyway 26(a) in contact with key 30; with front surface 16 forward with keyway 26(b) in contact with key 30; with rear surface 18 forward with keyway 26(a) in contact with key 30; or with rear surface 18 forward with keyway 26(b) in contact with key 30. The multiple keyway system is typically employed in an attempt to obtain consistent spacing between cleaning devices 10 and consistent pressure exerted between cleaning devices 10 and the associated workpieces. For consistent spacing, cleaning devices 10 are often mounted onto rotatable shaft 24 such that front surface 16 of one cleaning device 10 faces the rear surface 18 of another cleaning device 10. Further, cleaning devices 10 are typically mounted such that adjacent cleaning devices 10 have alternate keyways 26(a) and 26(b) in contact with key 30. If one cleaning device 10 is placed on rotatable shaft 24 incorrectly, several cleaning devices 10 might have to be removed from rotatable shaft 24 to correct the alignment of cleaning device 10.

Existing cleaning devices 10 used for cleaning workpieces are often made by growing sponge-like material 12 on core 14. Core 14 is typically made of poly vinyl chloride. Core 14 is stamp cut, cleaned, and aligned within the mold. Typically, core 14 is suspended in a mold by alignment spacers while sponge resin is poured into the mold to surround core 14. The mold containing the sponge resin is then shaken to reduce the amount of gas entrapped in the sponge resin. The sponge resin is then baked until it solidifies into a sponge-like material, ideally forming a single sponge surrounding the core. The sponge-like material is then trimmed.

Using this process, core 14 may be inadvertently displaced when the mold is shaken; inadvertent displacement of core 14 within the mold may result in uneven and unpredictable growth of sponge-like material 12 on core 14. If more sponge-like material is on one planar side of core 14, unequal pressure will be applied between the workpiece and cleaning device 10, resulting in unpredictable cleaning of the workpiece. Other manufacturing defects encountered with this process include: sponge-like material 12 not sealing over outer edge 20 of core 14, too many air bubbles in sponge-like material 12, and not enough sponge-like material 12 at the inner portion of core 14. Moreover, the stamping, shaking, and trimming steps are time consuming and labor intensive; these steps may unnecessarily increase the manufacturing cost of cleaning devices 10.

SUMMARY OF THE INVENTION

Accordingly, it is an advantage of the present invention that an improved cleaning element is provided that overcomes the limitations of the prior art.

It is another advantage of the present invention that the cleaning element is less susceptible to deformation during use.

A further advantage is that the present invention provides a cleaning element that is easy to mount onto a rotatable shaft.

Another advantage is that the cleaning element is less susceptible to misalignment during installation on the rotatable shaft.

Another advantage of the present invention is that the cleaning element is not susceptible to core misalignment during manufacturing.

The above and other advantages of the present invention are carried out in one form by a cleaning element for cleaning workpieces that includes sponge-like material interposed between two rigid plates. Such a cleaning element is more rigid than some prior-art cleaning elements that utilize a sponge-like material surrounding an inner core of rigid material. Thus, a cleaning element in accordance with the present invention is less susceptible to deformation where the key of the shaft contacts the cleaning element, and it is less susceptible to flexure caused by the force applied by the workpiece.

In accordance with a further aspect of the present invention, the spacers separating adjacent cleaning elements are integral to the cleaning elements. Thus, the time required to load the cleaning elements and spacers onto the rotatable shaft is reduced.

In accordance with a further aspect of the present invention, only one keyway is employed by the cleaning element. Thus, the cleaning element is less susceptible to misalignment during installation.

In accordance with still a further aspect of the present invention, the cleaning elements are less prone to manufacturing defects because the manufacturing process does not rely on centering a core within a mold; a center core need not be present during the fabrication of the cleaning elements. Thus, the cleaning element in accordance with the present invention has increased uniformity in the distribution of sponge-like material across a surface of the cleaning element, and the sponge-like material need not seal at the edges of the core.

BRIEF DESCRIPTION OF THE DRAWING FIGURES

The present invention will hereinafter be described in conjunction with the appended drawing figures, wherein like numerals denote like elements, and:

DETAILED DESCRIPTION OF PREFERRED EXEMPLARY EMBODIMENTS

The present invention relates to improved techniques for making and using cleaning elements useful in cleaning workpieces. While a cleaning element in accordance with the present invention may be used to clean a large variety of surfaces, the preferred exemplary embodiments discussed herein relate to the cleaning of semiconductor wafers, magnetic discs, and optical discs. It will be understood, however, that the invention is not limited to cleaning any particular workpieces; rather, the subject invention can be advantageously used in connection with a variety of possible workpiece configurations.

Figure 1:
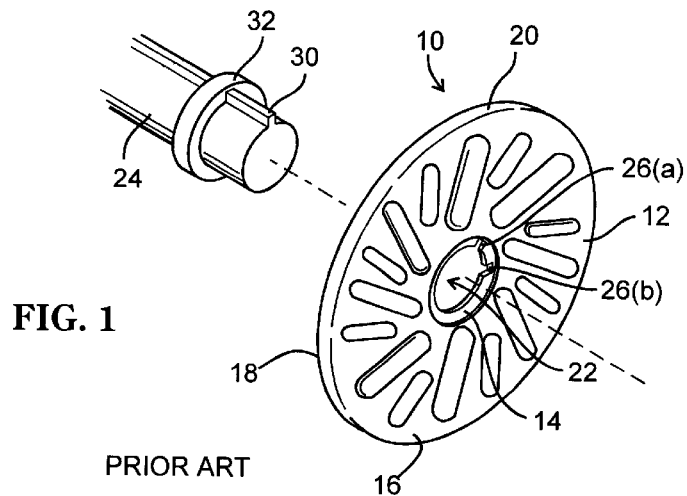
FIG. 1 is an exploded perspective view of a prior-art cleaning device.
Figure 2:
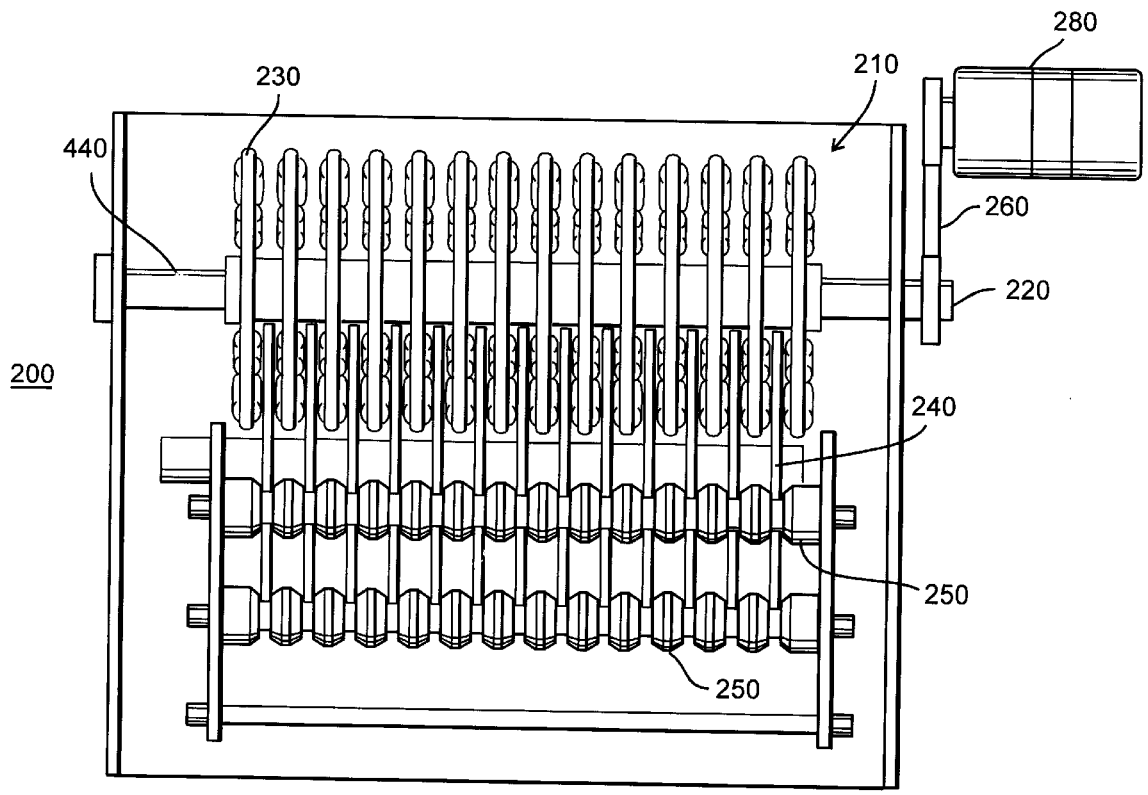
FIG. 2 is a cut-away side view of a cleaning apparatus used to clean workpieces.

With reference to FIG. 2, one method of cleaning workpieces includes using a cleaning apparatus 200 that suitably includes a cleaning assembly 210. Cleaning assembly 210 is typically configured to clean a plurality of workpieces 240, e.g., semiconductor wafers, magnetic recording discs, or optical recording discs. Cleaning assembly 210 suitably includes a rotatable shaft 220 with several cleaning elements 230 attached to rotatable shaft 220. Cleaning assembly 210 may include any number of cleaning elements 230 configured to clean surfaces of workpieces 240. Cleaning elements 230 are caused to rotate by rotatable shaft 220. Rotatable shaft 220 is typically driven by a belt 260 which in turn is driven by a motor 280.

Figure 3:
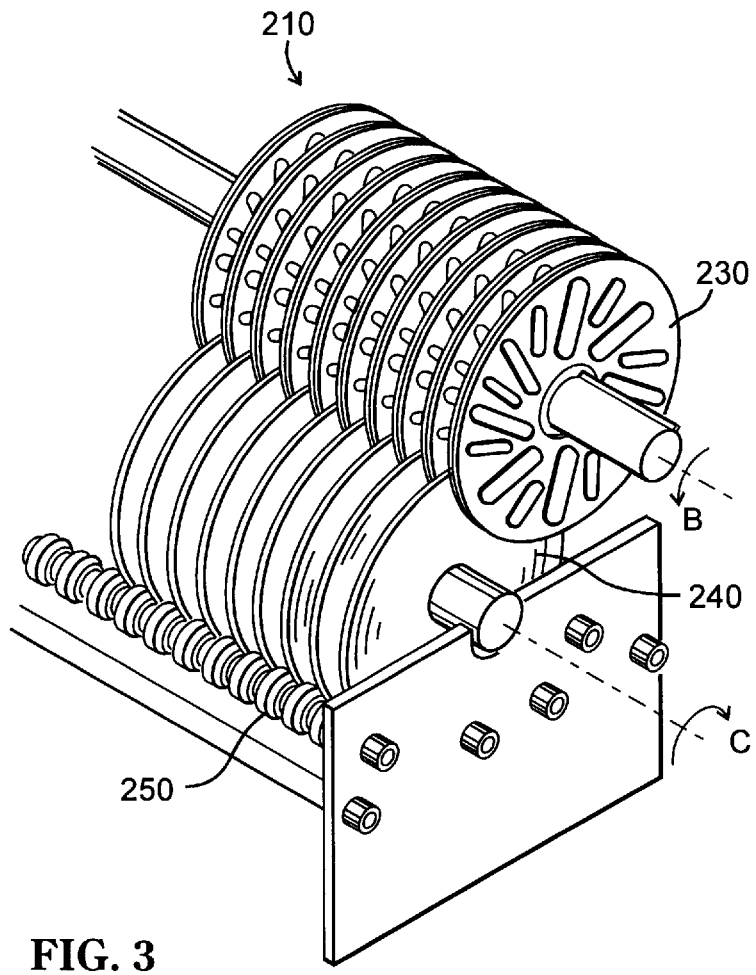
FIG. 3 is a perspective view showing a cleaning assembly and workpieces.

With reference to FIGS. 2 and 3, cleaning assembly 210, suitably including a plurality of substantially parallel cleaning elements 230, cleans workpieces 240 as respective cleaning elements 230 contact and move relative to the surfaces of workpieces 240. In the exemplary embodiment illustrated in FIG. 3, cleaning assembly 210 rotates in the direction shown by arrow B. Workpieces 240 are placed on a number of rollers 250 such that they are free to rotate in the direction shown by arrow C. Typically, workpieces 240 are interposed between two cleaning elements 230, allowing both sides of workpieces 240 to be cleaned simultaneously. As cleaning assembly 210 rotates in one direction, workpieces 240 tend to be driven in the opposite direction by cleaning elements 230. For example, if cleaning assembly 210 rotates in a clock-wise direction, then workpieces 240 rotate in a counter-clock-wise direction. One aspect of the cleaning occurs as cleaning element 230 moves relative to workpiece 240 and debris on the surface of workpieces 240 becomes trapped in a portion of cleaning element 230 and is removed from the surface of workpiece 240.

To minimize scratching of the surfaces of workpieces 240, the cleaning often takes place in the presence of a liquid such as deionized water. Cleaning element 230 may be kept moist by spraying the liquid over cleaning elements 230 and workpieces 240 or by keeping cleaning elements 230 immersed in the liquid. The liquid provides lubrication during the cleaning process and aids in the cleaning of cleaning element 230 and workpiece 240.

The present invention is described herein in the context of an exemplary cleaning element 230, and FIGS. 2–6 are for illustrative purposes only. It should be appreciated that FIGS. 2–6 are not meant to limit the various sponge-like material and plate shapes available for cleaning element 230.

Figure 4:
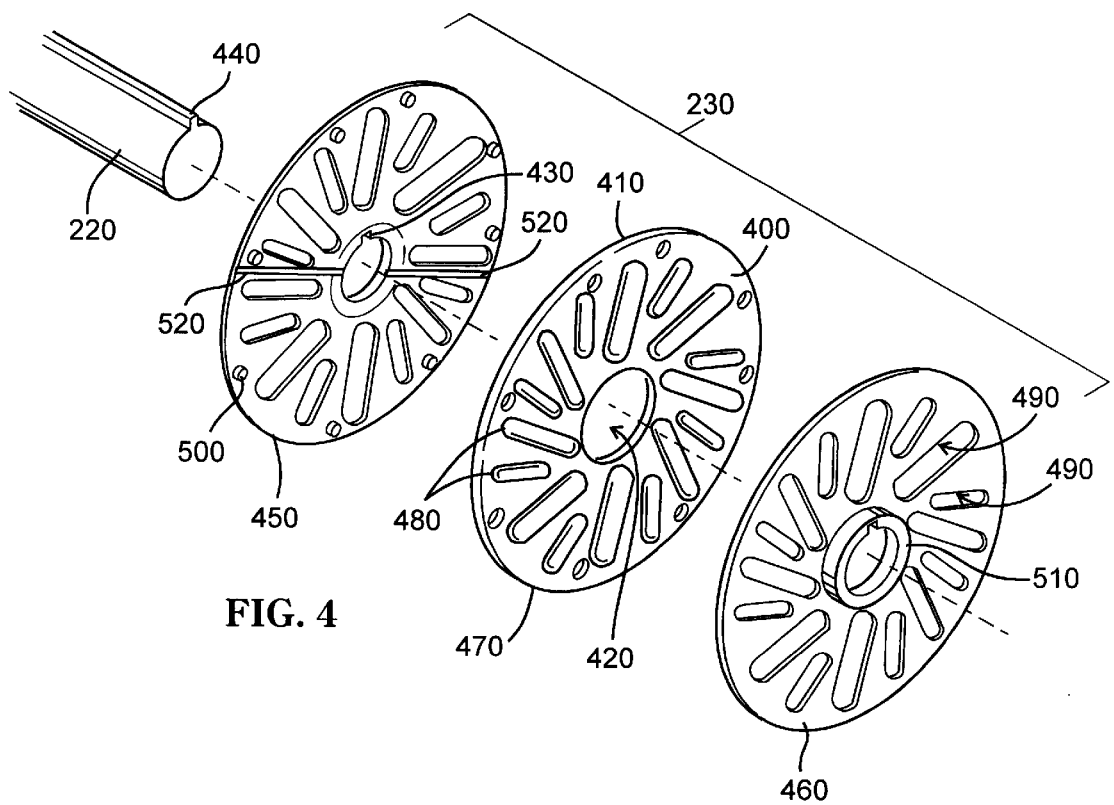
FIG. 4 is an exploded perspective view of a cleaning element in accordance with the present invention.

Cleaning element 230 is preferably attached to rotatable shaft 220 such that respective planar surfaces 400 and 410 of the cleaning elements, shown in FIG. 4, are substantially perpendicular to the longitudinal axis of rotatable shaft 220. Cleaning element 230 has a center aperture 420 to allow rotatable shaft 220 to pass through the center of cleaning element 230. Aperture 420 may include a keyway 430 formed therein and configured to receive a key 440 formed on rotatable shaft 220; consequently, cleaning element 230 rotates with rotatable shaft 220.

Figure 5:
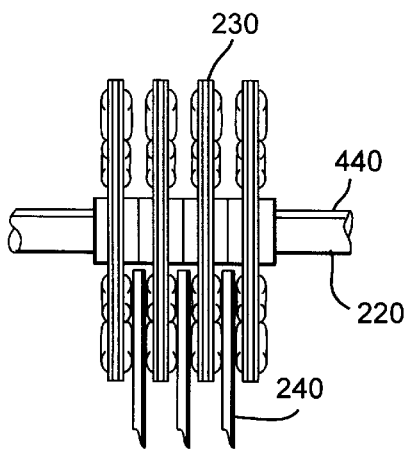
FIG. 5 is a side view of a rotatable shaft with cleaning elements attached.
Figure 6:
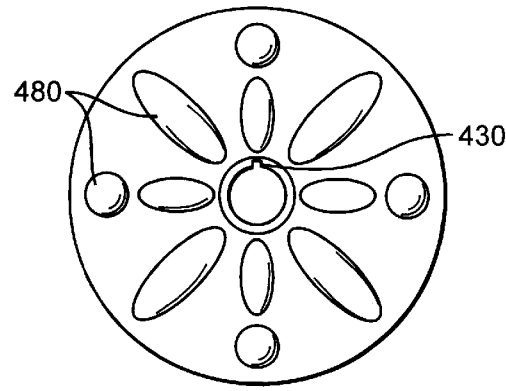
FIG. 6 is a plan view of a cleaning element according to an alternate embodiment of the present invention.

With reference to FIGS. 4 and 5, exemplary cleaning elements 230 suitably include two plates 450 and 460 and a sponge-like material 470. Plates 450 and 460 may be made of any rigid or semi-rigid material. In a preferred embodiment of the invention, plates 450 and 460 are formed from injection-molded plastic, and may be substantially identical to each other to for ease of manufacturing. In the context of this description, "sponge-like" refers to a substantially resilient material having physical properties appropriate for the particular application. For example, material 470 may be poly vinyl alcohol. Alternatively, material 470 may include any suitable composition known to those skilled in the art.

In a preferred embodiment of the present invention, plates 450 and 460 are mechanically coupled together with sponge-like material 470 located between plates 450 and 460. Sponge-like material 470 may be shaped or sized in any suitable manner. In a preferred embodiment of the invention, portions of sponge-like material 470, e.g., protrusions 480, protrude through a number of apertures 490 within respective plates 450 and 460. Protrusions 480 aid in the mechanical cleaning of workpiece 240 by trapping debris and wiping the debris away from the surface of workpiece 240.

Protrusions 480 are preferably molded as an integral part of sponge-like material 470. In a preferred embodiment of the invention, protrusions 480 on surface 400 are offset from protrusions 480 on surface 410 such that the cleaning elements may be attached to the rotatable shaft in the same direction using a single keyway 430. For the purpose of the present invention, "offset" means that protrusions 480 on surface 400 are substantially between protrusions 480 of surface 410. Offsetting the protrusions on surfaces 400 and 410 ensures substantially consistent pressure between workpieces 240 and cleaning elements 230. If protrusions 480 were not offset on surfaces 400 and 410, a dual keyway would be required to maintain substantially consistent pressure between workpieces 240 and cleaning elements 230. Use of offset protrusions 480 enables use of a single keyway 430; because there is only a single keyway 430, there is less chance for misalignment of cleaning elements 230 when assembling the cleaning assembly 210.

Referring to FIG. 4, plates 450 and 460 of cleaning element 230 may be mechanically connected in a variety of ways. In a preferred embodiment of the invention, plates 450 and 460 suitably include a number of respective energy directors 500. Energy directors 500 allow plates 450 and 460 to be mechanically fastened to each other by ultrasonic welding. In a preferred embodiment of the invention, energy directors 500 are molded into plates 450 and 460. In an alternative embodiment of the invention, a number of locking ear tabs (not shown) can be used to join plates 450 and 460 of cleaning element 230. In this alternative embodiment, the locking ear tabs may be incorporated into plates 450 and 460, allowing plates 450 and 460 to snap together.

Cleaning element 230 may also suitably employ a spacer 510 connected to at least one plate 450 and 460. Spacers 510 are important to help ensure that substantially similar pressure is applied by each cleaning element 230 to the surface of each workpiece 240. Similar pressure, in turn, helps ensure that each surface of each workpiece 240 will be similarly cleaned. In a preferred embodiment of the invention, spacers 510 are integral to plates 450 and 460. For example, spacer 510 and plates 450 and 460 may be formed during the same injection molding process. This may advantageously eliminate the need to later manually attach spacers 510. Spacers 510 may also be formed with an integral keyway 430. In this embodiment of the invention, cleaning element 230 is less susceptible to deformation and slippage than cleaning elements 230 without integral spacers 510 because more rigid material is available to receive the force from key 440 of the rotatable shaft 220.

In another embodiment of the present invention, plates 450 and 460 have a number of conduits 520 formed therein and are configured to allow solution to flow from the inner diameter of cleaning element 230 to the outer diameter of cleaning element 230. By allowing solution to flow from the inner diameter to the outer diameter, conduits 520 may aid in preventing build-up of the solution at the inner diamter of cleaning element 230. Prevention of solution build up may ensure more uniform cleaning across workpiece 240. Preferably, conduits 520 are integral to plate 450 and 460 and are adjacent to sponge-like material 470.

Plates 450 and 460 provide exo-skeleton support for sponge-like material 470. Plates 450 and 460 may provide more support than prior-art cleaning devices because they provide more rigid material. Because cleaning element 230 is more rigid than the prior-art cleaning devices, cleaning element 230 is less susceptible to deformation and slippage when force is applied from key 440 on rotatable shaft 220 to cleaning element 230 and between workpiece 240 and cleaning element 230.

Sponge-like material 470 is suitably formed by placing sponge resin into a mold, shaking or vibrating the mold to release gas bubbles, and baking the sponge resin to form a molded piece of sponge-like material 470. Sponge-like material 470 is then cleaned to remove contamination. Sponge4ike material 470 may be formed from many materials such as urethanes and poly vinyl alcohols. In a preferred embodiment of the invention, sponge-like material 470 is formed from poly vinyl alcohol. The shape of sponge-like material 470 may be of any configuration that allows a portion of sponge-like material 470 to extend through plates 450 and 460 (FIGS. 2–6 are illustrative examples only). Because the sponge is not "grown" over a core, as in the prior art, the problems with variations of the amount of material across a surface of the core and the variation in thickness of the sponge-like material from core surface to core surface are eliminated.

It will be understood that the foregoing description is of preferred exemplary embodiments of the invention and that the invention is not limited to the specific forms shown or described herein. Various modifications may be made in the design, arrangement, and type of elements disclosed herein, as well as the steps of making and using the invention without departing from the scope of the invention as expressed in the appended claims.

I claim:

1. An apparatus for improved cleaning of workpieces comprising a rotatable shaft with at least one cleaning element mounted thereto, said at least one cleaning element having a center aperture through which said shaft passes and further comprising:

a first substantially rigid plate having at least one second aperture formed therein; and a substantially resilient cleaning material having a first surface and a second surface and being adjacent to said plate and having at least one protrusion protruding through said at least one second aperture.

2. The apparatus of claim 1 further comprising at least one conduit formed within said first plate and extending from an inner diameter portion of said plate to an outer diameter portion of said plate, said at least one conduit being configured to allow solution to flow from said inner diameter portion to said outer diameter portion.

3. The apparatus of claim 1 wherein said substantially resilient cleaning material comprises poly vinyl alcohol.

4. A cleaning element comprising cleaning material supported by a substantially rigid exoskeleton having a plurality of apertures formed therein, said cleaning material having a plurality of raised protrusions received within and protruding through said apertures, and said cleaning element being mounted for rotation around a rotatable shaft via a center aperture formed in said element.

5. An apparatus for improved cleaning of workpieces comprising:
   a first substantially rigid plate having at least one aperture formed therein; and
   a substantially resilient cleaning material having a first surface and a second surface and being adjacent to said plate, wherein a plurality of protrusions are formed on said first and second surfaces, and said protrusions formed on said first surface are offset from said protrusions formed on said second surface, and at least one of said protrusions protrudes through said at least one aperture.

6. An apparatus for improved cleaning of workpieces comprising:
   a first substantially rigid plate having at least one aperture formed therein;
   a substantially resilient cleaning material having a first surface and a second surface and being adjacent to said plate and having at least one protrusion protruding through said at least one aperture; and
   a second substantially rigid plate adjacent to said cleaning material and having at least one aperture, said cleaning material having at least one protrusion protruding through said at least one aperture formed in said second plate.

7. The apparatus of claim 6 wherein said first substantially rigid plate and said second substantially rigid plate comprise injection-molded plastic.

8. The apparatus of claim 6 wherein at least one of said first and second substantially rigid plates comprise mechanical connectors adapted to mechanically fasten said first and second substantially rigid plates together.

9. The apparatus of claim 8 wherein said mechanical connectors comprise ultrasonic energy directors.

10. The apparatus of claim 8 wherein said mechanical connectors are molded as an integral part of at least one of said first and second substantially rigid plates.

11. The apparatus of claim 6 further comprising a spacer attached to at least one of said first and second substantially rigid plates.

12. The apparatus of claim 11 wherein said spacer comprises a keyway configured to receive a key associated with a rotatable shaft.

* * * * *